US008803461B2

(12) United States Patent
Tiwari et al.

(10) Patent No.: US 8,803,461 B2
(45) Date of Patent: Aug. 12, 2014

(54) SYSTEM AND METHOD FOR SYNCHRONOUS MACHINE HEALTH MONITORING

(76) Inventors: Arvind Kumar Tiwari, Bangalore (IN); Arijit Banerjee, Bangalore (IN); Hao Huang, Troy, OH (US); Xiaochuan Jia, Centerville, OH (US); Srilatha Boyanapally, Bangalore (IN); Rupam Mukherjee, Bangalore (IN)

( * ) Notice: Subject to any disclaimer, the term of this patent is extended or adjusted under 35 U.S.C. 154(b) by 346 days.

(21) Appl. No.: 12/976,309

(22) Filed: Dec. 22, 2010

(65) Prior Publication Data

US 2012/0161684 A1 Jun. 28, 2012

(51) Int. Cl.
*H02P 3/00* (2006.01)

(52) U.S. Cl.
USPC ............................................. 318/459; 318/500

(58) Field of Classification Search
USPC ................... 318/459, 500, 727, 700
See application file for complete search history.

(56) References Cited

U.S. PATENT DOCUMENTS

| | | | |
|---|---|---|---|
| 3,723,718 A | 3/1973 | Jaffe et al. | |
| 4,937,530 A * | 6/1990 | Vogt et al. | 324/545 |
| 5,252,915 A * | 10/1993 | Sedding et al. | 324/765.01 |
| 5,270,640 A * | 12/1993 | Kohler et al. | 324/765.01 |
| 5,345,158 A * | 9/1994 | Kliman et al. | 318/434 |
| 5,477,163 A * | 12/1995 | Kliman | 324/756.06 |
| 5,514,978 A * | 5/1996 | Koegl et al. | 324/750.02 |
| 5,612,601 A * | 3/1997 | Kueck et al. | 318/449 |
| 7,459,890 B2 | 12/2008 | Baratto et al. | |
| 2009/0059447 A1 | 3/2009 | Gajic | |
| 2009/0237022 A1 | 9/2009 | Yamamoto et al. | |
| 2010/0194323 A1 | 8/2010 | Premerlani et al. | |
| 2010/0194324 A1 | 8/2010 | Kasztenny et al. | |

* cited by examiner

*Primary Examiner* — Rina Duda

(74) *Attorney, Agent, or Firm* — Scott J. Asmus

(57) ABSTRACT

A method, system and computer program product for monitoring health of a synchronous machine is provided. The method includes receiving a plurality of phase voltage values and a plurality of phase current values. The method then computes a negative sequence voltage (Vn) based on the plurality of phase voltage values. The method also computes one or more operating parameters based on at least one of the plurality of phase voltage values and the plurality of phase current values. The method retrieves from a data store, one or more known Vn based on the one or more operating parameters. The method then computes a machine health indicator based on the computed Vn and the one or more known Vn, and raises an alarm based on the machine health indicator.

17 Claims, 4 Drawing Sheets

SYSTEM AND METHOD FOR SYNCHRONOUS MACHINE HEALTH MONITORING

BACKGROUND

Embodiments presented herein relate generally to diagnostics of synchronous machines and more specifically to health monitoring of synchronous machines.

A synchronous machine is one where the rotor rotates at a speed synchronous with the supply alternating current (AC) frequency. A conventional synchronous machine includes laminated armature windings disposed on a stator, and laminated field windings disposed on a rotor. The field winding of the synchronous machine is supplied with Direct Current (DC). Some small synchronous machines use permanent magnets in place of the field winding. Synchronous machines are extensively used in power plants, aviation power systems, power factor correction systems, and so forth.

Synchronous machines may operate in a generator mode, where an external prime mover rotates the rotor to produce AC power. Alternatively, synchronous machines may operate in a motoring mode, where external AC power generates a rotating magnetic field, thus turning the rotor. In both modes, the armature winding is subjected to a high electrical current and/or voltage during operation. The lamination of the armature windings may degrade with time and prolonged use, thus causing short circuits between successive turns of the armature winding. A short circuit tends to create circulating currents which in turn result in local hot spots within the armature.

If not detected and repaired in time, such faults may cause unplanned outages. In aviation engines, a failure of the synchronous generator may lead to loss of power to all control and support systems. Therefore, it is important that armature winding faults are detected at incipient stage, to plan appropriate maintenance tasks.

One known method for synchronous machine health monitoring includes creating a model of the synchronous machine, and simulating synchronous machine operation. However, synchronous machine models are created on the assumption that the spatial distribution of windings inside the machine is sinusoidal. The windings of a synchronous machine with an inter-turn fault no longer have a sinusoidal distribution. In other words, the model may not take into account the inherent asymmetry in winding distribution under fault conditions. This may lead to erroneous fault detection.

BRIEF DESCRIPTION

A method for synchronous machine health monitoring including receiving a plurality of phase voltage values and a plurality of phase current values, computing a negative sequence voltage (Vn) based on the plurality of phase voltage values, computing one or more operating parameters based on at least one of the plurality of phase voltage values and the plurality of phase current values, retrieving from a data store, one or more known Vn based on the one or more operating parameters, computing a machine health indicator based on the computed Vn and the one or more known Vn (updated based on the speed measurement), and raising an alarm based on the machine health indicator.

A system for synchronous machine health monitoring including a data receiver for receiving a plurality of phase voltage values and a plurality of phase current values, a sequence component module for computing a negative sequence voltage (Vn) based on the plurality of phase voltage values, a lookup module for retrieving from a data store, one or more known Vn based on at least one of the plurality of phase voltage values and the plurality of phase current values, a prognostic module for computing a machine health indicator based on the computed Vn and the one or more known Vn (updated based on the speed measurement), and an alarm module for raising an alarm based on the machine health indicator.

A computer program product comprising a non-transitory computer readable medium encoded with computer-executable instructions for monitoring health of a synchronous machine, wherein the computer executable instructions, when executed, cause one or more processors to receive a plurality of phase voltage values and a plurality of phase current values, compute a negative sequence voltage (Vn) based on the plurality of phase voltage values, compute one or more operating parameters based on at least one of the plurality of phase voltage values and the plurality of phase current values, retrieve from a data store, one or more known Vn based on the one or more operating parameters, compute a machine health indicator based on the computed Vn and the one or more known Vn (updated based on the speed measurement), and raise an alarm based on the machine health indicator.

DETAILED DESCRIPTION OF EMBODIMENTS

Figure 1:
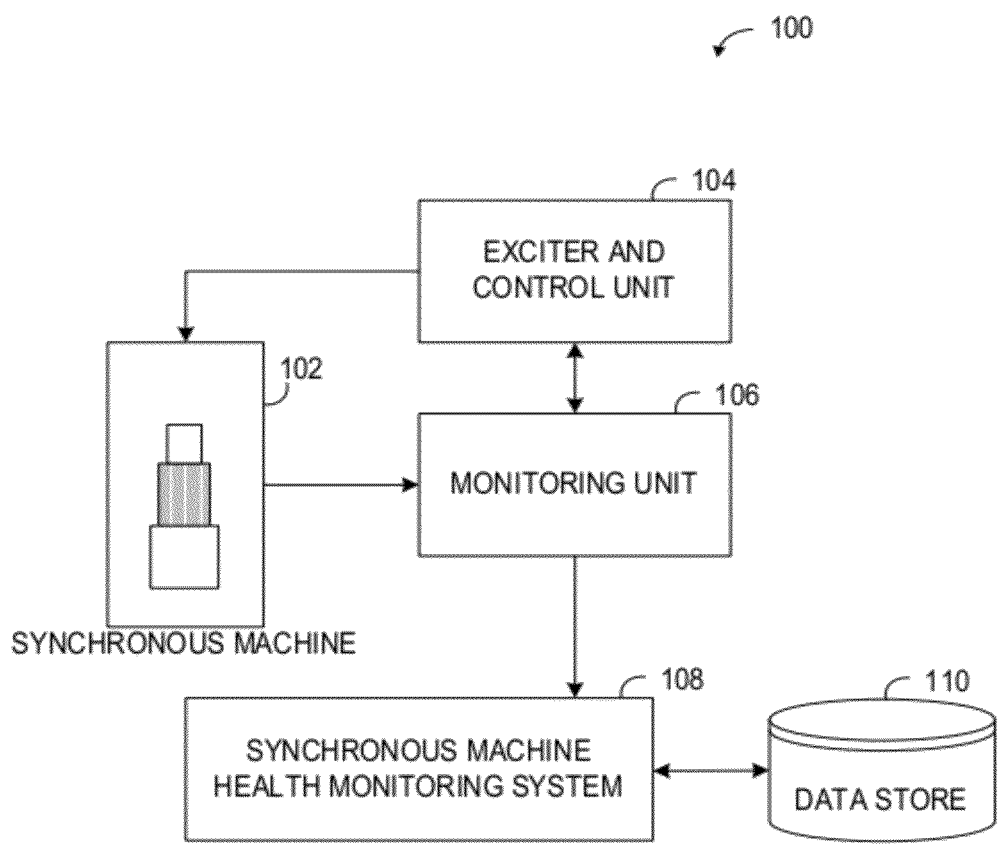
FIG. 1 is a simplified block diagram illustrating an exemplary environment in which various embodiments may operate.

Embodiments presented herein relate to a method and a system for monitoring health of a synchronous machine. FIG. 1 illustrates an environment 100 in which various embodiments may operate. The environment 100 includes a synchronous machine 102, an exciter and control unit 104, a monitoring unit 106, a synchronous machine health monitoring system 108 and a data store 110.

The synchronous machine 102 is an electromechanical energy conversion device where the rotor rotates at the same speed as the rotational speed of a rotating magnetic field. Example synchronous machines include synchronous generators, synchronous motors, and power factor compensators. The synchronous machine 102 may be switched between a motoring mode and a generating mode by changing the electrical connections. For instance, in aviation gas turbine engines, the synchronous machine 102 is an integrated starter-generator. The synchronous machine 102 operates in the motoring mode, accepting electrical energy from an onboard battery to start the gas turbine engine. Once the gas turbine engine is fired up, control electronics switch the synchronous machine 102 to the generating mode, accepting mechanical energy from the gas turbine engine shaft, and generating electrical power for the aircraft. The synchronous machine 102 includes a field winding and an armature winding. Typically, in low power and low torque applications the synchronous machine 102 may be of a rotating armature type including the field winding disposed on the stator, and the armature winding disposed on the rotor. In industrial applications involving high torque and high power, the synchronous machine 102 may be of a rotating field type including the field winding disposed on the rotor, and the armature winding disposed on the stator. Armature windings are laminated and typically carry a large current. Prolonged usage may degrade the lamination and may cause inter-turn faults. Various embodiments presented herein may be applied to detect inter-turn faults in the armature winding. The embodiments presented herein are described for the rotating field type synchronous machine. However, it should be appreciated that the embodiments may apply equally to all types of synchronous machine.

The exciter and control unit 104 includes an exciter such as, but not limited to, a DC generator, a battery, a rectified AC supply, or a static exciter, to excite the field windings. The static exciter feeds back a portion of the AC from each phase of generator output to the field windings, as DC excitations, through a system of transformers, rectifiers, and reactors. An external DC source may be used for initial excitation of the field windings. The exciter applies an excitation voltage, herein referred to as field voltage to the field windings of the synchronous machine 102, thereby causing a field current to flow through the field winding. Due to rotation of the field windings, the flux linked to stationary coils, disposed in a stator of the generator 102, varies in a sinusoidal fashion, causing a sinusoidal variation of voltage across the terminals of the stationary coils. The exciter and control unit 104 controls the operation of the generator 102. For example, the exciter and control unit 104 may control the field voltage, and field current supplied to the generator 102.

The synchronous machine 102 may be operated and controlled by the exciter and control unit 104. The exciter and control unit 104 may include direct current (DC) power supply, alternating current (AC) power supply, and a control system for controlling the operation of the synchronous machine 102. The control system may control the field winding voltage so that the voltage at the output remains constant. Further, the control system may control the power delivered to the synchronous machine 102 or the power delivered from the synchronous machine 102. The control system may also control the power factor of the synchronous machine 102. The exciter and control unit 104 controls the operation of the synchronous machine 102 based on operating data obtained from the monitoring unit 106.

The monitoring unit 106 may include one or more sensors for obtaining the operating data corresponding to the synchronous machine 102. The operating data may include phase current values, phase voltage values of one or more phases of the synchronous machine 102, and the speed of the synchronous machine. The operating data may further include a field current, an input power, an output power, a power factor, for example. The operating data may then be conveyed to the exciter and control unit 104 and the synchronous machine health monitoring system 108. The synchronous machine health monitoring system 108 has been described in detail in connection with FIG. 2.

In one embodiment, the monitoring unit 106, and the exciter and control unit 104 may be included in an integrated excitation, control and monitoring system. Such an integrated excitation, control and monitoring system may be implemented using hardware such as, but not limited to, microcontrollers, microprocessors, logic circuits, and memories; and software modules stored on the memories.

The environment 100 may further consist of the data store 110. The data store 110 may include data corresponding to the operation of the synchronous machine 102. For example, the data store 110 may include a look up table comprising a negative sequence voltage (Vn) of the synchronous machine 102 as a function of a positive sequence current and the field current at rated speed. The data store 110 may further include a magnetization characteristic of the magnetic material used for constructing the synchronous machine 102.

Figure 2A:
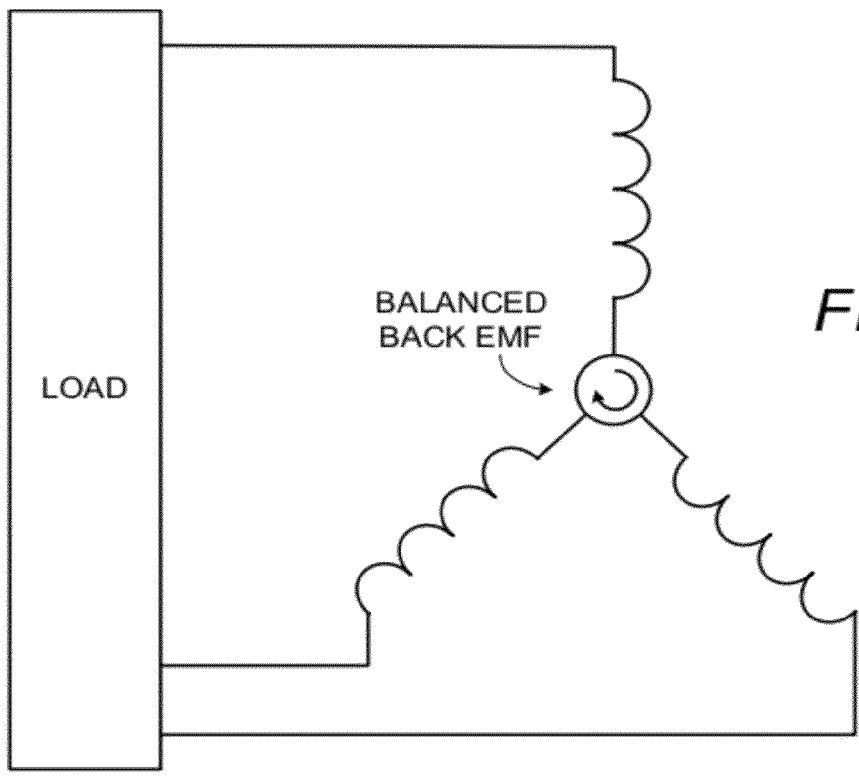
FIG. 2A is an exemplary circuit diagram of a healthy synchronous machine, according to one embodiment.
Figure 2B:
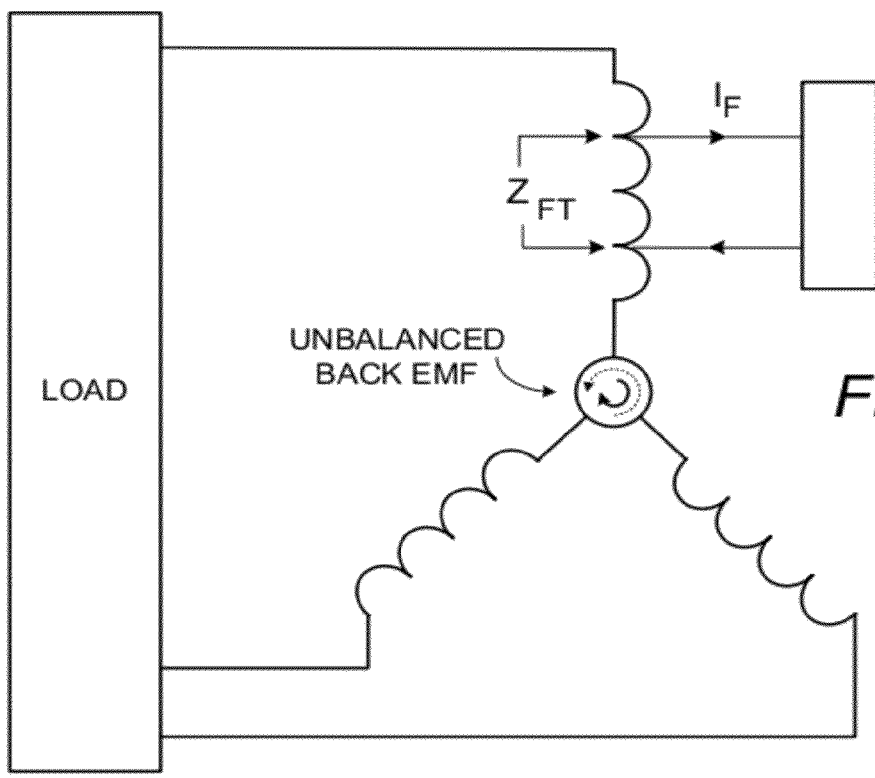
FIG. 2B is an exemplary circuit diagram of a synchronous machine with winding faults, according to one embodiment.

FIG. 2 illustrates the circuit level distinction between a healthy armature winding and an armature winding with a winding fault. FIG. 2A illustrates a healthy armature winding and FIG. 2B illustrates an armature winding with the winding fault. As shown in shown in FIG. 2B the winding fault creates an asymmetry in the magnetic field which further generates sequence components of the magnetic field. Sequence components of magnetic field include a positive sequence component, a negative sequence component and a zero sequence component. The negative sequence component of the magnetic field induces a negative sequence back electromotive force (EMF) in the armature winding. The negative sequence component typically carries the signature of the winding fault. Knowledge of the negative sequence back EMF may be used to detect the winding fault.

Typically, the negative sequence back EMF may not be measurable. The embodiments presented herein include a method of estimating the negative sequence back EMF manifested in terms of a machine health indicator. Said machine health indicator may be computed based on the negative sequence voltage (Vn) appearing at the terminals of the synchronous machine 102.

Figure 3:
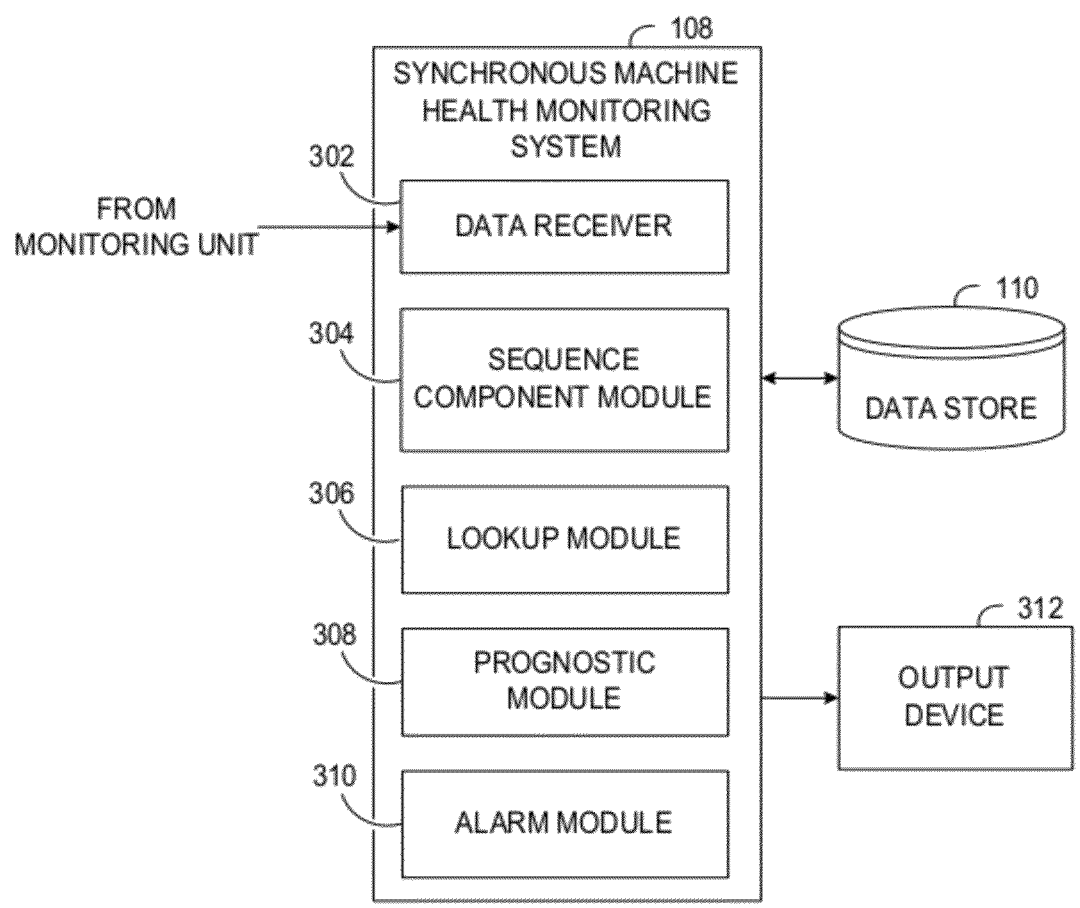
FIG. 3 is an exemplary synchronous machine health monitoring system, according to one embodiment.

FIG. 3 illustrates the synchronous machine health monitoring system 108, according to one embodiment. The synchronous machine health monitoring system 108 may include a data receiver 302 for receiving data associated with the synchronous machine 102. The data associated with the synchronous machine 102 may include the phase voltage values and the phase current values of one or more phases, speed, the field current, the power input, the power output, the power factor and the like. The data receiver 302 may also convert the phase voltage values into corresponding line voltage values, and phase currents into corresponding line currents.

The synchronous machine health monitoring system 108 may further include a sequence component module 304 for computing the sequence components of the phase voltage values, and the phase current values. The sequence components of phase voltage values may include a positive sequence voltage, a negative sequence voltage (Vn) and a zero sequence voltage. The sequence component module 304 may then the sequence components of the voltages and currents, as per the configuration of the synchronous machine. Different configurations of the synchronous machine carry inter-turn fault signatures in different sequence components. For a three phase three wire configuration, or a balanced load configuration, the sequence component module 304 may compute a Vn from the received phase voltage values or line voltage values. For instance, for a three phase three wire configuration or a balance load configuration of the synchronous machine 102, the sequence component module 304 computes the negative sequence voltage Vn. For an unbalanced load configuration of the synchronous machine 102, the sequence component module 304 computes the negative sequence current In, and the negative sequence impedance Znn, in addition to the Vn. Further, for a three phase four wire configuration of the synchronous machine 102, the sequence component module 304 computes the zero sequence current I0, in addition to the Vn, In, and Znn.

The synchronous machine health monitoring system 108 may further include a lookup module 306 for retrieving one or more known Vn. The known values of one or more Vn may be obtained from the data store 110. The data store 110 may include the known and healthy Vn values tabulated as a function of the field current, the positive sequence current at one particular speed, for example. The Vn values may correspond to the rated speed of the synchronous machine. After retrieving the known Vn, the lookup module may scale the retrieved Vn based on the measured speed of the synchronous machine. The Vn values and the speed of the synchronous machine have a linear relationship with each other. Alternatively, the data store 110 may include different sets of known Vn values for different speeds of the synchronous machine 102. In an embodiment, the lookup module 306 may further include a computing unit for computing the field current and the positive sequence current based on the plurality of phase current values. The positive sequence current may be obtained from the plurality of phase current values. Similarly, the field current may be obtained based on the plurality of phase current values and the magnetization characteristic of the synchronous machine 102. The magnetization characteristics may be stored in the data store 110. The lookup module 306 may retrieve the magnetization characteristics data from the data store 110 for computing the field current. In an embodiment, the known Vn may be retrieved based on the field current and the positive sequence current.

The lookup module 306 may further have a query unit for querying the data store 110 using the field current and the positive sequence current. The query unit may retrieve the one or more known Vn values, wherein the Vn values may include an open circuit Vn and a healthy state Vn. The open circuit Vn may obtained by retrieving that open circuit Vn entry from the lookup table that corresponds the field current computed by the lookup module 306. Further, the healthy state Vn is obtained by retrieving that Vn entry from the lookup table that corresponds to the positive sequence current and the field current computed by the lookup module 306.

As described above different configurations of the synchronous machine 102 may carry inter-turn fault signatures in different sequence components. In the implementation for an unbalanced three phase configuration, the data store 110 may additionally include known In and known Znn values at particular speeds, tabulated as a function of the field current and the positive sequence current. Alternatively, in the implementation for a three phase four wire configuration, the data store 110 may include a known I0 in addition to the known Vn, known In, and known Znn values at particular speeds. The lookup module 306 may retrieve the known In, known Zn, and known I0 values using similar techniques as described for retrieving the known Vn.

The synchronous machine health monitoring system 108 may further include a prognostic module 308 for computing a machine health indicator based on the computed Vn and the one or more known Vn. In an embodiment, the machine health indicator may be computed by obtaining a phasor difference of the health state Vn and the computed Vn and normalizing the phasor difference with respect to the open circuit Vn. The health of the synchronous machine 102 may be assessed based on the machine health indicator. The machine health indicator has a specific healthy state value. If the machine health indicator computed by the prognostic module 308 is different from the healthy state value then an inter-turn fault in the armature of the synchronous machine 102, may be indicated. The healthy state value of the machine health indicator may be obtained by testing a healthy synchronous machine. Alternately, the healthy state value may be obtained by performing simulations on a model of the synchronous machine 102.

The system 108 may further include an alarm module 310. The alarm module 310 may raise an alarm if the machine health indicator deviates from the healthy state value. The fault condition may be indicated through the output device 312. In an embodiment the output device 312 may be a display device displaying a warning. In an alternate embodiment, the display device may be an audio alarm. The output device 312 may further be an audiovisual alarm.

In various embodiments, the alarm module 310 may use statistical methods to raise an alarm. For example, the alarm module 310 may monitor the machine health indicator over, say, a 5 minute window. The alarm module 310 may then compute the proportion of the duration for which the machine health indicator deviates from the healthy state value during the 5 minute window. The alarm module 310 may then raise a flag based on the computed proportion. Alternatively, the alarm module 310 may use statistical variability measures such as, but not limited to, standard deviation or statistical mean. The alarm module 310 may compute a mean of the machine health indicator over a 15 minute window, for example. The alarm module 310 may then compare the mean with a healthy state value of the machine health indicator, and raise an alarm if the mean deviates from the healthy state value by a predetermined amount. The use of statistical methods may prevent momentary variations in the machine health indicator from triggering an alarm. This may be useful to reduce false alarms.

Figure 4:
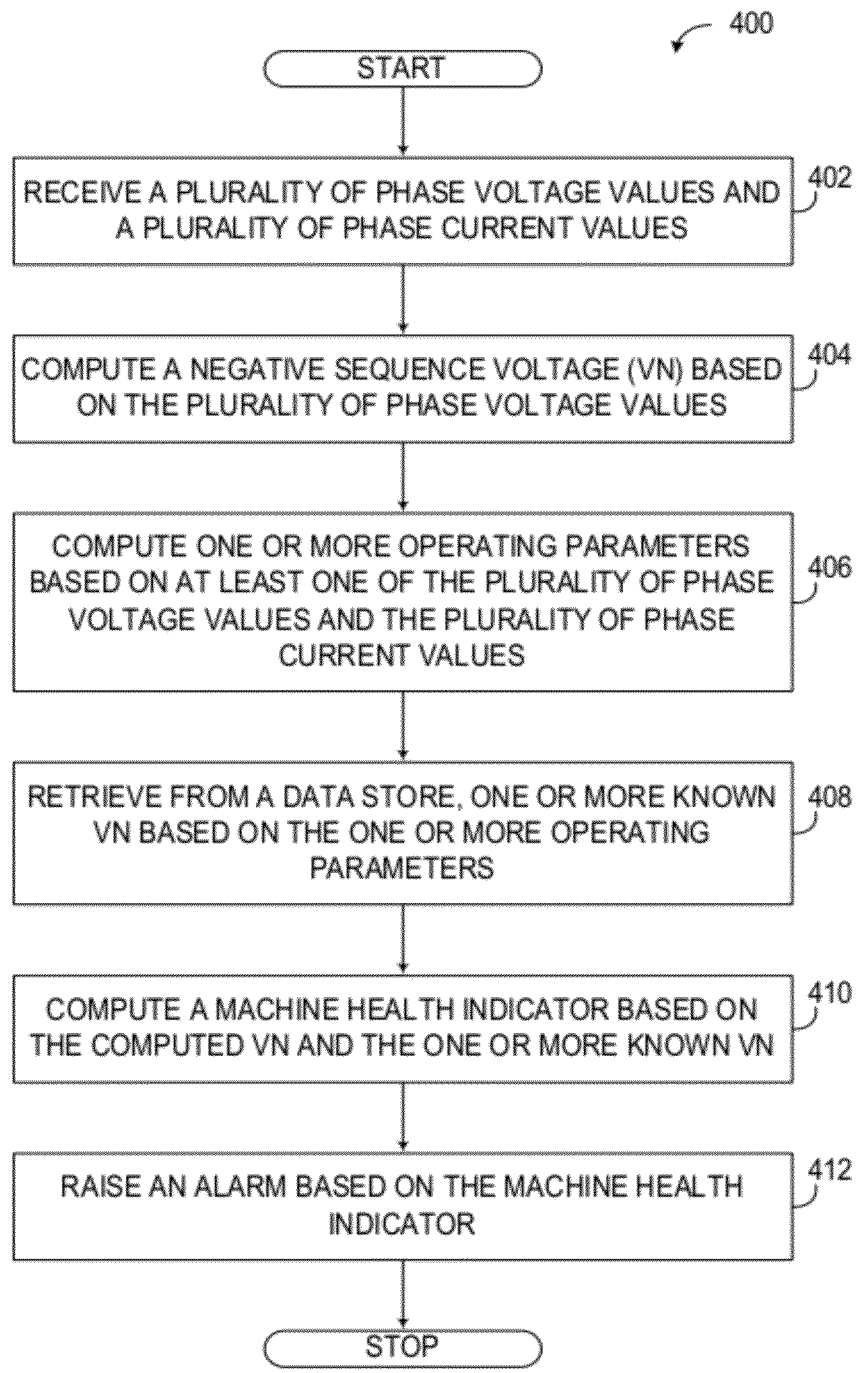
FIG. 4 is a flowchart illustrating an exemplary process of synchronous machine health monitoring, according to one embodiment.

FIG. 4 is a flowchart illustrating a process 400 for synchronous machine health monitoring, according to an embodiment. In step 402 a plurality of phase voltage values and a plurality of phase current values may be received. Other data pertaining to the operation of the synchronous machine 102 may also be received. For example, synchronous machine speed, power input, power output, power factor and the like may be received. In an embodiment, the received phase voltage values may be transformed into line voltage values. It may be appreciated that the line voltage values and the phase voltage values are phasor quantities and have a phase angle associated with them. Therefore the process 400 may associate a particular phase angle to each of the phase voltage values and phase current values. A necessary phase shift should be incorporated while obtaining the line voltage values from the phase voltage values.

In step 404 the Vn may be computed based on the phase voltage values. The Vn may be computed by multiplying the each of the phase voltage values by a suitable factor and then taking the phasor sum of each of the phase voltage values.

In step 406 one or more operating parameters may be computed based on the phase voltage values and the phase current values. In an embodiment, the one or more operating parameters may be computed based on the line voltage values and the line current values. The operating parameters may include the field current, and the positive sequence current. The field current may be computed based on the magnetization characteristics and the phase current values. The magnetization characteristics data may be retrieved from the data store 110. Further, the positive sequence current may be computed based on the phase current values corresponding to the three phases of the synchronous machine 102.

In step 408 one or more known Vn values may be obtained based on the one or more operating parameters. The known values of one or more Vn may be obtained from the data store 110. The data store 110 may include the known Vn values tabulated as a function of the field current, the positive sequence current, for various different values of synchronous machine speed. The data store 110 may further have the known Vn values corresponding to a healthy synchronous machine.

The known values of the Vn may include the healthy state Vn and the healthy open circuit Vn. The open circuit Vn may obtained by retrieving that open circuit Vn entry from the lookup table that corresponds to the field current obtained in step 406, and the received value of synchronous machine speed. Further, the healthy state Vn is obtained by retrieving that Vn entry from the lookup table which corresponds to the positive sequence current, the field current obtained in step 406, and the received value of synchronous machine speed.

In one embodiment, for prognostics of an unbalanced three phase configuration, the synchronous machine health monitoring system 102 may additionally obtain known In and known Znn values. In another embodiment, for prognostics of a three phase four wire configuration, the synchronous machine health monitoring system 102 may obtain a known I0 in addition to the known Vn, known In, and known Znn values.

In step 410, the machine health indicator may be computed based on the computed Vn and the one or more known Vn. In an embodiment, the machine health indicator may be computed by obtaining a phasor difference of the healthy state Vn and the computed Vn and normalizing the phasor difference with respect to the open circuit Vn. The health of the synchronous machine 102 may be assessed based on the machine health indicator. The machine health indicator has a specific healthy state value. If the machine health indicator computed by the prognostic module 408 is different from the healthy state value then an inter-turn fault in the armature of the synchronous machine 102 may be inferred.

In step 412, an alarm may be raised based on the value of the machine health indicator. The alarm may be raised by comparing the machine health indicator with a predefined threshold. The predefined threshold may be the healthy state value of the machine health indicator. As described in connection with FIG. 3 the alarm may be audio, visual or audio-visual.

In various embodiments the synchronous machine health monitoring system 108 may be implemented as computer executable instructions. The system 108 may have one or more processors for executing the computer executable instructions. The computer readable instructions may be embodied into a non-transitory computer readable medium such as a magnetic storage disc, an optical storage disc, and so forth. Alternatively, the computer readable medium may be one of a Random Access Memory (RAM), Read Only Memory (ROM), Programmable Read Only Memory (PROM), Erasable Programmable Read Only Memory (EPROM) and the like.

The coded instructions of the computer program product may include instructions for receiving the plurality of phase voltage values, phase current values, computing Vn based on the plurality of phase voltage values and the plurality of current values, computing the one or more operating parameters based on the phase voltage values and the phase current values. The operating parameters may include the field current and the positive sequence current. The computer program product may further have coded instructions for converting the phase voltage values into line voltage values. The computer program product may further have coded instructions for retrieving the open circuit Vn and the healthy state Vn from the data store 110. The computer program product may further have instructions for computing the machine health indicator by obtaining the phasor difference of the healthy state Vn and the computed Vn, and normalizing the phasor difference with respect to the open circuit Vn. The computer program product may also have coded instructions for comparing the machine health indicator with the predefine threshold and raising an alarm based on the comparison.

It may be noted that the voltages and the current, except the field current, disclosed herein are phasor quantities and are manipulated according to the rules of phasor algebra unless explicitly stated otherwise.

The embodiments described herein are solely for the purpose of illustration. Persons skilled in the art will recognize from this description that the teachings presented herein are not limited to the embodiments described, but may be practiced with modifications and alterations limited only by the spirit and scope of the appended claims.

The invention claimed is:

1. A method for synchronous machine health monitoring comprising:
receiving a plurality of phase voltage values and a plurality of phase current values;
computing a plurality of voltage phasors based on the plurality of phase voltage values;
computing a negative sequence voltage (Vn) based on the plurality of phase voltage values, wherein the Vn is representative of a negative sequence back electromotive force (EMF) which represents a signature of a winding fault in a corresponding configuration of a synchronous machine;
computing one or more operating parameters based on at least one of the plurality of phase voltage values and the plurality of phase current values;
retrieving from a lookup data store, one or more known Vn based on the one or more operating parameters;
computing a machine health indicator based on the computed Vn and the one or more known Vn wherein the one or more known Vn may be scaled according to a measured speed of the synchronous machine, wherein computing the machine health indicator comprises:
computing a phasor difference between the healthy state Vn and the computed Vn; and
normalizing the phasor difference with respect to the healthy open circuit Vn; and
raising an alarm based on the machine health indicator, wherein the raising an alarm based on the machine health indicator comprises comparing a computed value of the machine health indicator with a healthy state value of the machine health indicator.

2. The method of claim 1 further comprising:
computing a negative sequence current (In) and a negative sequence impedance (Znn) based on the plurality of phase voltage values and the plurality of phase current values;
retrieving from a data store, one or more known In, and one or more known Znn based on the one or more operating parameters; and
taking into account the computed In, the computed Znn, the one or more known In, and the one or more known Znn, for computing the machine health indicator.

3. The method of claim 2 further comprising:
computing a zero sequence current (I0) based on the plurality of phase current values;
retrieving from a data store, one or more known I0 based on the one or more operating parameters; and
taking into account the computed I0 and the one or more known I0, for computing the machine health indicator.

4. The method of claim 1 further comprising converting the plurality of phase voltage values to a plurality of line voltage values.

5. The method of claim 1 wherein computing the one or more operating parameters comprises:
   computing a field current value based on the plurality of phase currents; and
   computing a positive sequence current based on the plurality of phase currents.

6. The method of claim 1 wherein the one or more known Vn comprises at least one of a healthy open circuit Vn and a healthy state Vn.

7. The method of claim 1 wherein raising the alarm comprises:
   comparing the machine health indicator to a predefined threshold; and
   setting an alarm flag responsive to the comparison.

8. A system for synchronous machine health monitoring comprising:
   a data receiver for receiving a plurality of phase voltage values and a plurality of phase current values;
   a sequence component module for computing a negative sequence voltage (Vn) based on the plurality of phase voltage values, wherein the Vn is representative of a negative sequence back electromotive force (EMF) which represents a signature of a winding fault in a corresponding configuration of a synchronous machine;
   a lookup module for retrieving from a data store, one or more known Vn based on at least one of the plurality of phase voltage values and the plurality of phase current values;
   an prognostic module for computing a plurality of voltage phasors based on the plurality of phase voltage values and computing a machine health indicator based on the computed Vn and the one or more known Vn, wherein the one or more known Vn may be scaled according to a measured speed of the synchronous machine and wherein computing the machine health indicator comprises computing a phasor difference between the healthy state Vn and the computed Vn; and normalizing the phasor difference with respect to the healthy open circuit Vn; and
   an alarm module for raising an alarm based on the machine health indicator; wherein the alarm module is configured to compare a computed value of the machine health indicator with a healthy state value of the machine health indicator.

9. The system of claim 8, wherein:
   the sequence component module further computes at least one of a negative sequence current (In), a negative sequence impedance (Znn), and a zero sequence current (I0) based on the plurality of phase voltage values and the plurality of phase current values;
   the lookup module further retrieves at least one of a known In, a known Znn, and a known I0; and
   the prognostic module computes the machine health indicator further based on at least one of the computed In, the computed Znn, and the computed I0, the known In, the known Znn, and the known I0.

10. The system of claim 8 further comprising a data store for storing the one or more known Vn, wherein the one or more known Vn comprises at least one of a healthy open circuit Vn and a healthy state Vn.

11. The system of claim 8 wherein the lookup module further comprises:
   a computing unit for computing a field current and a positive sequence current based on the plurality of phase current values; and
   a query unit for querying the data store using the field current and the positive sequence current.

12. A computer program product comprising a non-transitory computer readable medium encoded with computer-executable instructions for monitoring health of a synchronous machine, wherein the computer executable instructions, when executed, cause one or more processors:
   receive a plurality of phase voltage values and a plurality of phase current values;
   compute a plurality of voltage phasors based on the plurality of phase voltage values;
   compute a negative sequence voltage (Vn) based on the plurality of phase voltage values, wherein the Vn is representative of a negative sequence back electromotive force (EMF) which represents a signature of a winding fault in a corresponding configuration of a synchronous machine;
   compute one or more operating parameters based on at least one of the plurality of phase voltage values and the plurality of phase current values;
   retrieve from a lookup data store, one or more known Vn based on the one or more operating parameters;
   compute a machine health indicator based on the computed Vn and the one or more known Vn, wherein the one or more known Vn may be scaled according to a measured speed of the synchronous machine;
   compute a phasor difference between the healthy state Vn and the computed Vn; and
   normalize the phasor difference with respect to the open circuit Vn; and
   raise an alarm based on the machine health indicator, wherein the alarm is raised further based on a comparison of a computed value of the machine health indicator with a healthy state value of the machine health indicator.

13. The computer program product of claim 12:
   compute at least one of a negative sequence current (In), a negative sequence impedance (Znn), and a zero sequence current (I0) based on the plurality of phase voltage values and the plurality of phase current values;
   retrieve at least one of a known In, a known Znn, and a known I0; and
   compute the machine health indicator further based on at least one of the computed In, the computed Znn, and the computed I0, the known In, the known Znn, and the known I0.

14. The computer program product of claim 12 further comprising computer executable instructions to cause the one or more processors to convert the plurality of phase voltage values to a plurality of line voltage values.

15. The computer program product of claim 12 further comprising computer executable instructions to cause the one or more processors to:
   compute a field current value based on the plurality of phase currents; and
   compute a positive sequence current based on the plurality of phase currents.

16. The computer program product of claim 12, wherein the one or more known Vn comprises at least one of an open circuit Vn and a healthy state Vn.

17. The computer program product of claim 12 further comprising computer executable instructions to cause the one or more processors to:

compare the machine health indicator to a predefined threshold; and set an alarm flag responsive to the comparison.

* * * * *